(12) United States Patent
Li

(10) Patent No.: US 12,543,474 B2
(45) Date of Patent: Feb. 3, 2026

(54) LIGHT-EMITTING SUBSTRATE AND LIGHT-EMITTING DEVICE

(71) Applicants: Beijing BOE Technology Development Co., Ltd., Beijing (CN); BOE Technology Group Co., Ltd., Beijing (CN)

(72) Inventor: Dong Li, Beijing (CN)

(73) Assignees: Beijing BOE Technology Development Co., Ltd., Beijing (CN); BOE Technology Group Co., Ltd., Beijing (CN)

(*) Notice: Subject to any disclaimer, the term of this patent is extended or adjusted under 35 U.S.C. 154(b) by 536 days.

(21) Appl. No.: 17/913,295

(22) PCT Filed: Nov. 9, 2021

(86) PCT No.: PCT/CN2021/129591
§ 371 (c)(1),
(2) Date: Sep. 21, 2022

(87) PCT Pub. No.: WO2022/237096
PCT Pub. Date: Nov. 17, 2022

(65) Prior Publication Data
US 2024/0215419 A1    Jun. 27, 2024

(30) Foreign Application Priority Data
May 13, 2021 (CN) .......................... 202110525627.9

(51) Int. Cl.
*H10K 59/80*    (2023.01)
*H10K 50/115*   (2023.01)
*H10K 59/122*   (2023.01)

(52) U.S. Cl.
CPC ......... *H10K 59/805* (2023.02); *H10K 50/115* (2023.02); *H10K 59/122* (2023.02); *H10K 59/8794* (2023.02)

(58) Field of Classification Search
CPC .............. H10K 59/805; H10K 59/122; H10K 59/8794; H10K 59/173; H10K 59/00–95;
(Continued)

(56) References Cited

U.S. PATENT DOCUMENTS

2009/0215350 A1* 8/2009 Takei ................... H10K 50/824
                                                        445/23
2010/0052524 A1   3/2010 Kinoshita
(Continued)

FOREIGN PATENT DOCUMENTS

CN   101170162 A   4/2008
CN   101599538 A   12/2009
(Continued)

OTHER PUBLICATIONS

Seki Translation (Year: 2012).*
(Continued)

*Primary Examiner* — Steven B Gauthier
*Assistant Examiner* — Rhys Poniente Sheker
(74) *Attorney, Agent, or Firm* — IPro, PLLC

(57) ABSTRACT

The present disclosure provides a light-emitting substrate and a light-emitting device. The light-emitting substrate includes: a first electrode layer on a base substrate; a pixel definition layer arranged on a part of the first electrode layer and a part of the base substrate not covered by the first electrode layer, the pixel definition layer including at least two pixel definition aperture regions and a non-pixel aperture region other than the pixel definition aperture regions, the non-pixel aperture region being arranged with a groove on a side surface away from the base substrate, and a first
(Continued)

thermally-conductive member being arranged in the groove; a first functional layer, a light-emitting layer and a second functional layer arranged in the pixel definition aperture regions; and a second electrode covering the second functional layer and the pixel definition layer, the second electrode being coupled to the first thermally-conductive member.

12 Claims, 3 Drawing Sheets

(58) Field of Classification Search
CPC . H10K 50/115; H10K 50/87; H10K 50/00–88
See application file for complete search history.

(56) References Cited

U.S. PATENT DOCUMENTS

| | | | |
|---|---|---|---|
| 2015/0207095 A1* | 7/2015 | Mun | H10K 59/8794 257/40 |
| 2017/0194596 A1 | 7/2017 | Shen et al. | |
| 2019/0074470 A1* | 3/2019 | Takagi | H10K 59/8794 |
| 2020/0203655 A1 | 6/2020 | Wan et al. | |
| 2021/0066629 A1* | 3/2021 | Li | H10K 50/115 |

FOREIGN PATENT DOCUMENTS

| | | | | | |
|---|---|---|---|---|---|
| CN | 102412365 | A | | 4/2012 | |
| CN | 108682754 | A | | 10/2018 | |
| CN | 108878668 | A | | 11/2018 | |
| CN | 108987608 | A | | 12/2018 | |
| CN | 109166882 | A | * | 1/2019 | ......... H01L 27/3246 |
| CN | 109390493 | A | | 2/2019 | |
| CN | 109449177 | A | | 3/2019 | |
| CN | 109638053 | A | | 4/2019 | |
| CN | 109817669 | A | | 5/2019 | |
| CN | 110176550 | A | | 8/2019 | |
| CN | 110299469 | A | * | 10/2019 | ......... H01L 27/3244 |
| CN | 209496874 | U | | 10/2019 | |
| CN | 216120359 | U | | 3/2022 | |
| JP | 2010056017 | A | | 3/2010 | |
| JP | 2012142094 | A | * | 7/2012 | |

OTHER PUBLICATIONS

Wei English translation (Year: 2019).*
Zhu English translation (Year: 2019).*
CN 202110525627.9 first office action dated Sep. 30, 2024.
Yuan Xue, et al. "Heat Exchange of Organic Light Emitting Devices." Journal of Xi''an Jiaotong University. 43(4), pp. 70-74. Apr. 2009.
PCT/CN2021/129591 international search report and written opinion.
CN 202110525627.9 second office action dated Feb. 22, 2025.

* cited by examiner

LIGHT-EMITTING SUBSTRATE AND LIGHT-EMITTING DEVICE

CROSS-REFERENCE TO RELATED APPLICATIONS

This application is the U.S. national phase of PCT Application No. PCT/CN2021/129591 filed on Nov. 9, 2021, which claims a priority of the Chinese Patent Application No. 202110525627.9 filed on May 13, 2021, the entire contents of which are hereby incorporated by reference.

TECHNICAL FIELD

The present disclosure relates to the field of display technology, in particular to a light-emitting substrate and a light-emitting device.

BACKGROUND

With the rapid development of organic materials and quantum-dot materials, Organic Light-Emitting Diode (OLED) and Quantum-dot Light-Emitting Diode (QLED) devices have developed rapidly, and with the increase in the consumer spending, high-resolution products have become the focus of display products.

Active Matrix Quantum-dot Light-Emitting Diode (AMQLED) has attracted more and more attention due to such potential advantages as wide color gamut and long service life. Through continuous researches, quantum efficiency increases continuously to substantially reach the level of industrialization. It has become a future trend to further adopt new processes and technologies to realize its industrialization.

However, after the energization, heat is generated inside a QLED film, and a hot point is formed in the center of a pixel. In addition, along with the accumulation of the heat, a temperature increases continuously, so an organic film layer may be decomposed and a quantum-dot ligand may fall off, and thereby a service life and stability of the device may be adversely affected.

SUMMARY

An object of the present disclosure is to provide a light-emitting substrate and a light-emitting device, so as to effectively dissipate heat generated by a light-emitting element during the operation, thereby to improve the stability of the light-emitting element.

The present disclosure provides the following technical solutions.

In one aspect, the present disclosure provides in some embodiments a light-emitting substrate, including: a first electrode layer on a base substrate; a pixel definition layer arranged on a part of the first electrode layer and a part of the base substrate not covered by the first electrode layer, the pixel definition layer including at least two pixel definition aperture regions and a non-pixel aperture region other than the pixel definition aperture regions, the non-pixel aperture region being arranged with a groove on a side surface away from the base substrate, and a first thermally-conductive member being arranged in the groove; a first functional layer, a light-emitting layer and a second functional layer arranged in the pixel definition aperture regions; and a second electrode covering the second functional layer and the pixel definition layer, the second electrode being coupled to the first thermally-conductive member.

In a possible embodiment of the present disclosure, the first thermally-conductive member is made of a metallic material and/or a graphene-based carbon material.

In a possible embodiment of the present disclosure, the first electrode layer includes a plurality of first electrode patterns arranged in an array form, an orthogonal projection of the groove onto the base substrate is located between orthogonal projections of adjacent first electrode patterns onto the base substrate, a depth of the groove in a direction perpendicular to the base substrate is less than a thickness of the pixel definition layer in the direction perpendicular to the base substrate, and the first thermally-conductive member in the groove is not in contact with the first electrode pattern adjacent to the groove.

In a possible embodiment of the present disclosure, the first thermally-conductive member is arranged at a same layer and made of a same material as the second electrode, the second electrode covers the non-pixel aperture region, the second functional layer and the groove in a shape-following manner, and a part of the second electrode covering the groove in a shape-following manner is the first thermally-conductive member.

In a possible embodiment of the present disclosure, the first thermally-conductive member is arranged at a same layer and made of a same material as the second electrode, the second electrode covers the non-pixel aperture region, the second functional layer and the groove, a side surface of the second electrode away from the base substrate is a planar surface, and a part of the second electrode in the groove is the first thermally-conductive member.

In a possible embodiment of the present disclosure, the first thermally-conductive member is arranged at a layer different from the second electrode, the groove is filled up with the first thermally-conductive member, the second electrode covers the non-pixel aperture region, the second functional layer and the first thermally-conductive member, and the first thermally-conductive member is made of a material identical to or different from the second electrode.

In a possible embodiment of the present disclosure, the second electrode is covered with a first thermally-conductive layer at a side away from the base substrate, and the first thermally-conductive layer has thermal conductivity greater than the second electrode; and/or the second electrode includes a composite thin film made of an electrically conductive silver paste and a highly thermally-conductive material having thermal conductivity greater than the electrically conductive silver paste.

In a possible embodiment of the present disclosure, the first thermally-conductive layer is made of a graphene-based carbon material, and the composite thin film is made of an electrically conductive silver paste and a graphene-based carbon material.

In a possible embodiment of the present disclosure, the light-emitting substrate includes a display region and a non-display region surrounding the display region, and the second electrode at least partially covers the non-display region not covered by the pixel definition layer. The light-emitting substrate further includes a second thermally-conductive layer arranged on a side of the base substrate away from the first electrode layer, the base substrate is provided in the non-display region with a thermally-conductive through-hole extending from a side of the base substrate close to the first electrode layer to a side away from the first electrode layer, a second thermally-conductive member is arranged in the thermally-conductive through-hole, and a part of the second electrode covering the non-display region is coupled to the second thermally-conductive layer via the second thermally-conductive member.

In a possible embodiment of the present disclosure, the second thermally-conductive member is made of a thermally-conductive metallic material and/or a thermally-conductive graphene material.

In a possible embodiment of the present disclosure, the light-emitting layer includes a quantum-dot light-emitting layer.

In another aspect, the present disclosure provides in some embodiments a light-emitting device including the above-mentioned light-emitting substrate.

The present disclosure has the following beneficial effects.

According to the light-emitting substrate and the light-emitting device in the embodiments of the present disclosure, the first electrode layer is arranged on the base substrate, the first pixel definition layer is provided with the pixel defining hole regions for defining pixels, the first functional layer, the light-emitting layer and the second functional layer are laminated one on another in each pixel definition aperture region, the groove is formed in the non-pixel aperture region between the pixel definition aperture regions, the thermally-conductive material is filled in the groove to form the first thermally-conductive member, and the second electrode covers the second functional layer and the pixel definition layer so as to be directly coupled to the first thermally-conductive member. As a result, heat in a pixel is rapidly dissipated from a side surface of the pixel through a top electrode of the light-emitting substrate, i.e., the second electrode, and the first thermally-conductive member between the pixels, so it is able to prevent a service life of the device from being adversely affected due to the accumulation of the heat. In addition, the top electrode is directly coupled to the first thermally-conductive member, so it is able to improve a heat dissipation effect.

DETAILED DESCRIPTION

Figure 1:
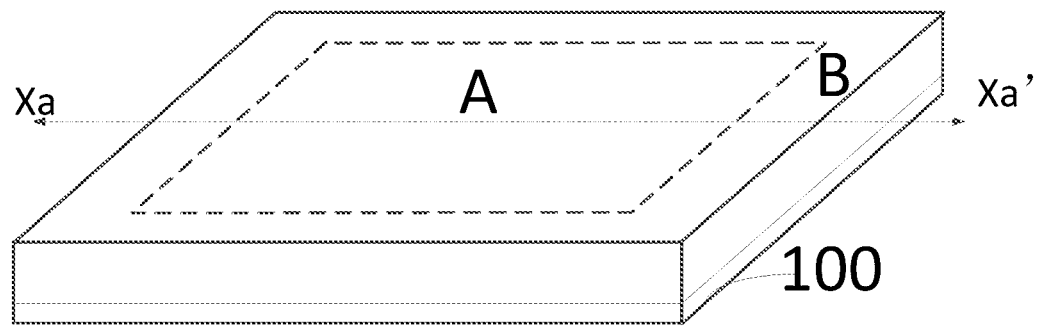
FIG. 1 a solid view of a light-emitting substrate according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Before the detailed description, it is necessary to provide the following description on the related art.

For an electroluminescent element, such as a QLED light-emitting element, when the light-emitting element is in an operating state, heat is generated inside a film layer, and a hot point occurs in the center of a pixel. At this time, a service life of the element is adversely affected due to the accumulation of heat. Generally, a top electrode of the QLED light-emitting element is mostly a thin metal electrode or a transparent oxide electrode, and due to its poor thermal conductivity, and the generated heat is not easily dissipated through the top electrode, so the heat is accumulated in the pixel and thereby the service life of the element is adversely affected.

An object of the present disclosure is to provide a light-emitting substrate and a light-emitting device, so as to effectively dissipate heat generated by a light-emitting element during the operation, thereby to improve the stability of the light-emitting element.

As shown in FIGS. 1 to 8, the present disclosure provides in some embodiments a light-emitting substrate, which includes a first electrode layer 200, a first functional layer 300, a light-emitting layer 400, a second functional layer 500, a second electrode 600 and a pixel definition layer 700 on a base substrate 100. The first electrode layer 200 is arranged on the base substrate 100, and includes a plurality of first electrode patterns 2001 arranged in an array form. The pixel definition layer 700 is arranged on a part of the first electrode layer 200 and a part of the base substrate 100 not covered by the first electrode layer 200, and includes at least two pixel definition aperture regions 710 arranged at intervals for defining pixels. The first functional layer 300, the light-emitting layer 400 and the second functional layer 500 are laminated one on another in the pixel definition aperture regions 710. The part of the pixel definition layer 700 without the pixel definition aperture regions 710 is a non-pixel aperture region, and the non-pixel aperture region is a region other than the pixel definition aperture regions 710. At least one groove 720 is formed in a side surface of the non-pixel aperture region away from the base substrate 100, and a first thermally-conductive member 800 is arranged in the groove 720. The second electrode 600 covers the pixel definition layer 700 and the second functional layer 500, i.e., the second electrode 600 is a top electrode of the light-emitting element. The second electrode 600 is directly coupled to the first thermally-conductive member 800, and the first thermally-conductive member 800 forms a heat dissipation path for the second electrode 600.

Based on the above, the top electrode of the light-emitting element, i.e., the second electrode 600, is directly coupled to the first thermally-conductive member 800 in the groove 720 between the pixels in the pixel definition layer 700, and the heat generated by the top electrode is quickly dissipated from the pixel region to the side surface of the pixel directly via the first thermally-conductive member 800 at the side surface of the pixel, so it is able to prevent a service life of the element from being adversely affected due to the accumulation of heat. In addition, the top electrode is directly coupled to the first thermally-conductive member 800 without any other intermediate film layers for heat dissipation, so it is able to improve a heat dissipation effect.

In some embodiments of the present disclosure, the first thermally-conductive member 800 is made of a highly thermally-conductive material, for example, a thermal conductivity of the first thermally-conductive member 800 is greater than or equal to that of the second electrode 600. In a possible embodiment of the present disclosure, for example, the first thermally-conductive member 800 is made of a metallic material, a graphene-based carbon material, or a composite material or a laminated material thereof. The graphene-based carbon material includes one or more of graphene, graphite, carbon fiber, SiC, carbon nanotube, carbon 60 (C60), and carbon 70 (C70). It should be appreciated that, the first thermally-conductive member 800 may be made of a thermally-conductive material with good thermal conductivity according to the practical need.

Figure 2:
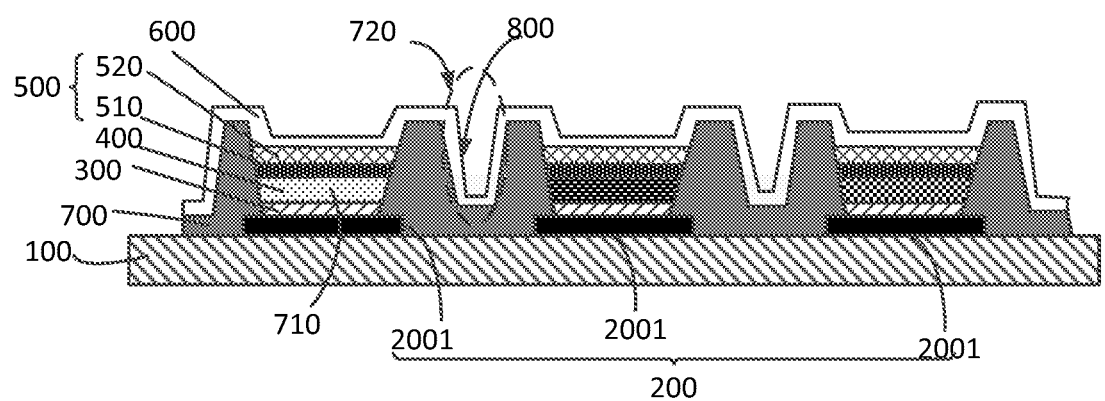
FIG. 2 a partial sectional view of the light-emitting substrate in a display region along line Xa-Xa' in FIG. 1.

Furthermore, in some embodiments of the present disclosure, as shown in FIG. 2, an orthogonal projection of the groove 720 onto the base substrate 100 is located between orthogonal projections of adjacent first electrode patterns 2001 onto the base substrate 100, a depth of the groove 720 in a direction perpendicular to the base substrate 100 is less than a thickness of the pixel definition layer 700 in the direction perpendicular to the base substrate 100, and the first thermally-conductive member 800 in the groove 720 is not in contact with the first electrode pattern 2001 adjacent to the groove 720.

In other words, the groove 720 is located in the middle between the adjacent first electrode patterns 2001, so as to, on one hand, dissipate the heat generated by the pixels at both sides of the groove 720, and on the other hand, prevent the groove 720 from extending through the pixel definition layer 700 and thereby prevent the first thermally-conductive member 800 in the groove 720 from being in contact with a bottom electrode (namely, the first electrode pattern 2001). If the groove 720 extends through the pixel definition layer 700 and is in contact with the first electrode pattern 2001, the first thermally-conductive member 800 should be made of an insulative, thermally-conductive material whose thermal conductivity is less than a metallic material or an electrically-conductive graphene-based carbon material. Hence, based on the above, the groove 720 does not extend through the pixel definition layer 700 and the first thermally-conductive member 800 is not in contact with the bottom electrode (the first electrode patterns 2001), so the first thermally-conductive member 800 may be made of an electrically-conductive metallic material or a graphene-based carbon material to further improve the heat dissipation.

In some embodiments of the present disclosure, the depth of the groove 720 in the direction perpendicular to the base substrate 100 is 150 nm to 1500 nm, and the thickness of the pixel definition layer 700 in the direction perpendicular to the base substrate 100 is 200 nm to 2000 nm. In this way, the depth of the groove 720 is as large as possible to ensure the heat dissipation effect of the first thermally-conductive member 800. In addition, the depth of the groove 720 is insufficiently large so as to prevent the structure of the element from being in contact with the bottom electrode. It should be appreciated that, the thickness of the pixel definition layer 700 and the depth of the groove 720 will not be particularly defined herein.

Furthermore, as shown in FIG. 2, in some embodiments of the present disclosure, the first thermally-conductive member 800 in the groove 720 is spaced apart from the light-emitting layer 400 in the pixel definition aperture region 710 by a predetermined distance in a direction parallel to the base substrate 100, and the predetermined distance ranges from 1 microns to 5 microns. In this way, the width of the groove 720 is as large as possible to ensure the heat dissipation effect of the first thermally-conductive member 800. In addition, it is able to prevent the heat from the first thermally-conductive member 800 from adversely affecting a film layer of the pixel. It should be appreciated that, the thickness of the pixel definition layer 700 and the width of the groove 720 will not be particularly defined herein.

Furthermore, in some embodiments of the present disclosure, the orthogonal projection of the groove 720 onto the base substrate 100 is of a rectangular, circular or any other regular or irregular shape. The groove 720 has an inverted trapezoidal cross-sectional shape in the direction perpendicular to the base substrate 100. It should be appreciated that, a specific shape of the groove 720 Will not be particularly defined herein.

Furthermore, in some embodiments of the present disclosure, the first thermally-conductive member 800 in the groove 720 is made of a material identical to or different from the second electrode 600, which will be described hereinafter illustratively.

In some embodiments of the present disclosure, as shown in FIG. 2, the first thermally-conductive member 800 is arranged at a same layer, and made of a same material, as the second electrode 600. The second electrode 600 covers the non-pixel aperture region, the second functional layer 500 and the groove 720 in a shape-following manner, and a part of the second electrode 600 covering the groove 720 in a shape-following manner is the first thermally-conductive member 800. In the embodiments of the present disclosure, a film thickness of the first thermally-conductive member 800 is substantially equal to a film thickness of the second electrode 600. During the manufacture of the light-emitting substrate, the second electrode 600 is formed through evaporation or the like so as to cover the non-pixel aperture region of the pixel definition layer 700, the groove 720 and the second functional layer 500 in a shape-following manner.

Figure 3:
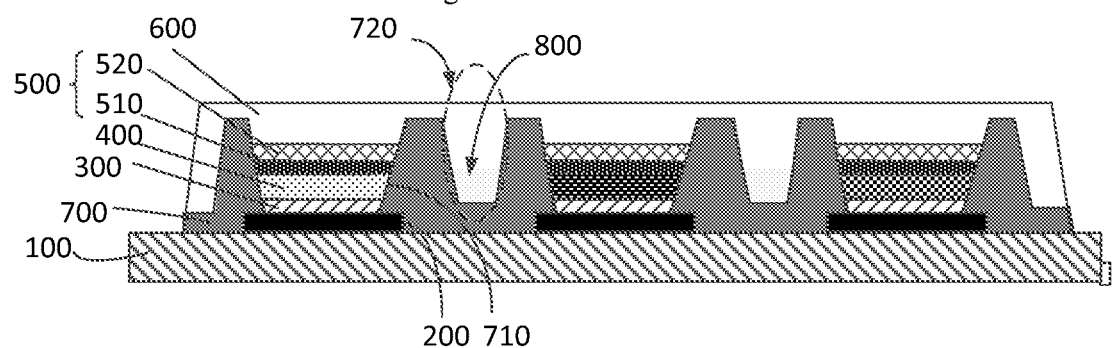
FIG. 3 is another partial sectional view of the light-emitting substrate in the display region along line Xa-Xa' in FIG. 1.

In some other embodiments of the present disclosure, as shown in FIG. 3, the first thermally-conductive member 800 is arranged at a same layer, and made of a same material, as the second electrode 600. The second electrode 600 covers the non-pixel aperture region, the second functional layer 500 and the groove 720, and a side surface of the second electrode 600 away from the base substrate 100 is a planar surface, and a part of the second electrode 600 in the groove 720 is the first thermally-conductive member 800. In the embodiments of the present disclosure, the second electrode 600 is a thin film made of a conductive silver paste. During the formation of the second electrode 600, the groove 720 is directly filled up with the second electrode 600 may directly fill the groove 720 and an uneven region on the pixel definition layer 700 is levelled by the second electrode 600, so as to form a flat surface at a side away from the base substrate 100.

Figure 4:
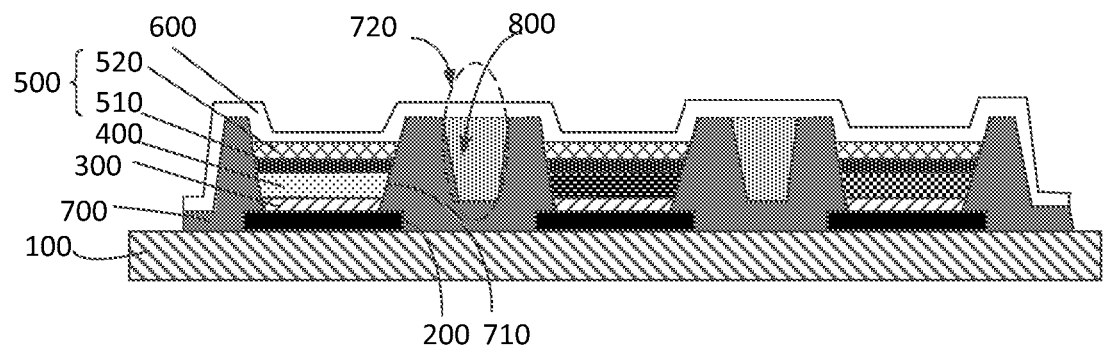
FIG. 4 is yet another partial sectional view of the light-emitting substrate in the display region along line Xa-Xa' in FIG. 1.
Figure 5:
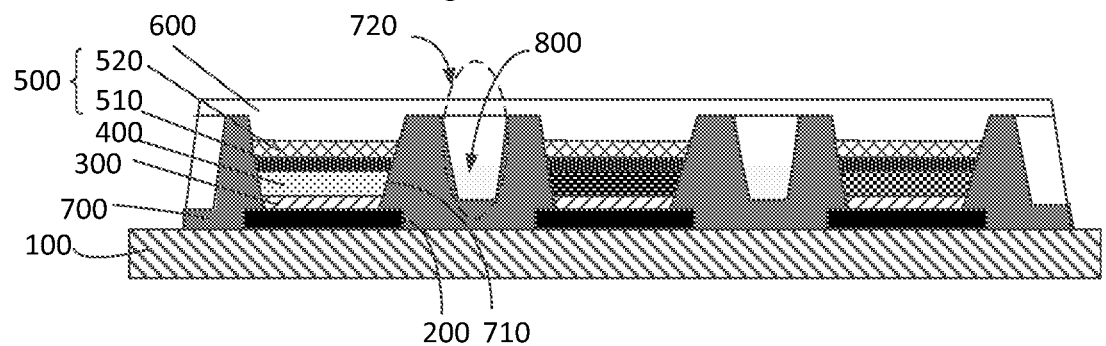
FIG. 5 is still yet another partial sectional view of the light-emitting substrate in the display region along line Xa-Xa' in FIG. 1.

In some other embodiments of the present disclosure, as shown in FIGS. 4 and 5, the first thermally-conductive member 800 is arranged at a layer different from the second electrode 600, the groove 720 is filled up with the first thermally-conductive member 800, the second electrode 600 covers the non-pixel aperture region, the second functional layer 500 and the first thermally-conductive member 800, and the first thermally-conductive member 800 is made of a material identical to or different from the second electrode 600.

It should be appreciated that, in the embodiments of the present disclosure, when the groove 720 is filled up with the first thermally-conductive member 800, it means that the surface of the first thermally-conductive member 800 away from the base substrate 100 is flush with the surface of the pixel definition layer 700 away from the base substrate 100, or a distance between the surface of the first thermally-conductive member 800 away from the base substrate 100 and the base substrate 100 is equal to a distance between the surface of the pixel definition layer 700 away from the base substrate 100 and the base substrate 100 in a thickness direction of the base substrate.

In the embodiments of the present disclosure, the first thermally-conductive member 800 fills the groove 720, and then the second electrode 600 is formed. At this time, the first thermally-conductive member 800 is made of a material identical to or different from the second electrode 600. The second electrode 600 covers the non-pixel aperture region, the second functional layer 500 and the first thermally-conductive member 800 in a shape-following manner (for example, when the second electrode 600 is a metal electrode as shown in FIG. 4), or the second electrode 600 covers the non-pixel aperture region, the second functional layer 500 and the first thermally-conductive member 800, and a side surface away from the base substrate 100 is a planar surface (for example, when the second electrode 600 is an electrically-conductive silver paste film as shown in FIG. 5).

In addition, thermal conductivity of some common metals and transparent conductive thin films is listed in Table 1.

TABLE 1

| | Al | Ag | Au | ITO | Graphene-based carbon material |
|---|---|---|---|---|---|
| Thermal Conductivity (W/mK) | 237 | 429 | 317 | 1-30 | about 5300 |

As shown in Table 1, the thermal conductivity of graphene-based carbon materials, for example, graphene, graphite, C fiber, SiC, C nanotube, C60 or C70 is several tens of times higher than the thermal conductivity of the common metals, i.e., the heat dissipation effect is better than that of the common metals.

Figure 6:
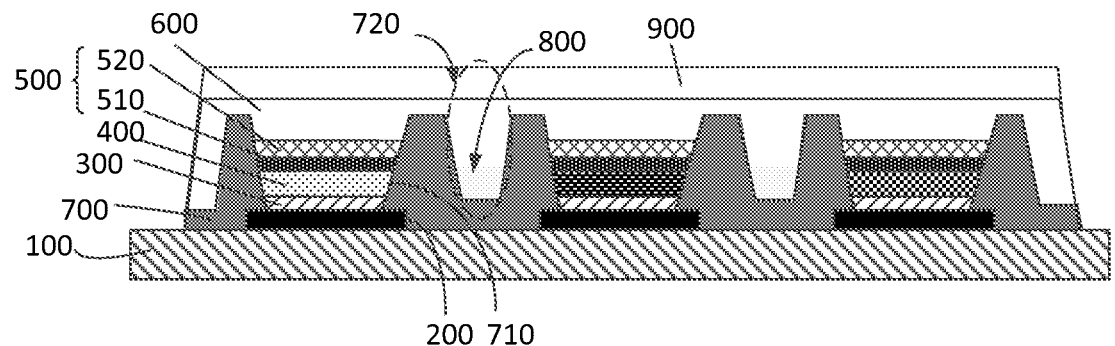
FIG. 6 is still yet another partial sectional view of the light-emitting substrate in the display region along line Xa-Xa' in FIG. 1.
Figure 7:
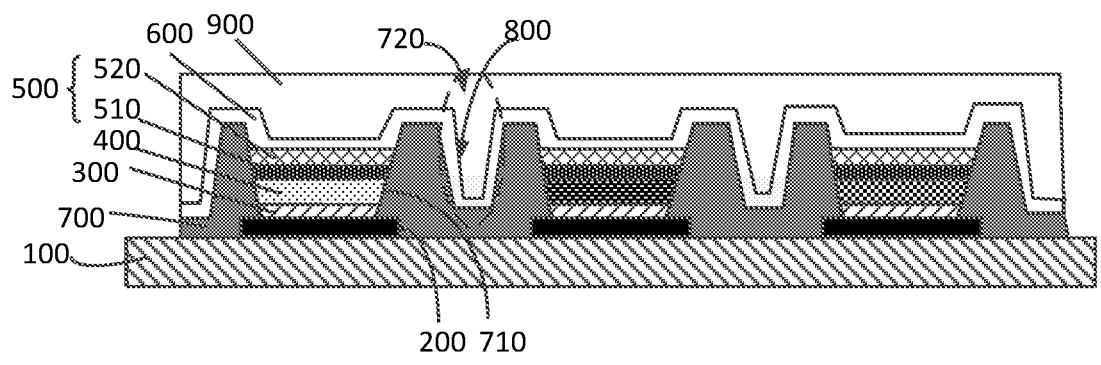
FIG. 7 is still yet another partial sectional view of the light-emitting substrate in the display region along line Xa-Xa' in FIG. 1.
Figure 8:
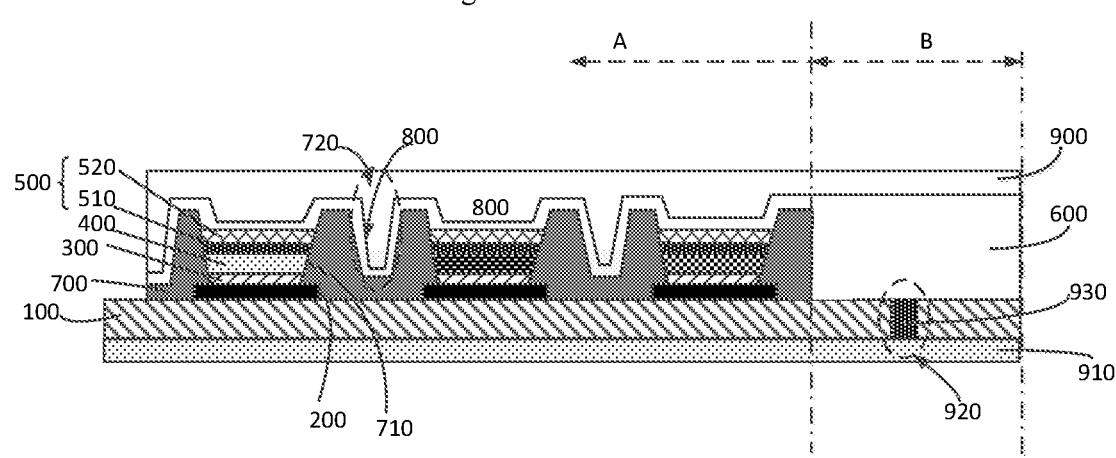
FIG. 8 is a partial sectional view of the light-emitting substrate in the display region and a non-display region along line Xa-Xa' in FIG. 1.

In order to improve the heat dissipation effect for the top electrode, in some embodiments of the present disclosure, as shown in FIGS. 6-8, the second electrode 600 is covered with a first thermally-conductive layer 900 on a side away from the base substrate 100, and the first thermally-conductive layer 900 has thermal conductivity greater than the second electrode 600. The first thermally-conductive layer 900 is made of a graphene-based carbon material, for example, one or more of graphene, graphite, C fibers, SiC, C nanotubes, C60 and C70.

In some other embodiments of the present disclosure, in order to improve the heat dissipation effect for the top electrode, as shown in FIG. 3, the second electrode 600 is a composite thin film made of an electrically conductive silver paste and a highly thermally-conductive material. Thermal conductivity of the highly thermally-conductive material is greater than that of the electrically conductive silver paste, and the highly thermally-conductive material is a graphene-based carbon material, that is to say, the composite thin film is made of an electrically conductive silver paste and a graphene-based carbon material.

In some other embodiments of the present disclosure, in order to improve the heat dissipation effect for the top electrode, as shown in FIG. 6, the second electrode 600 is covered with the first thermally-conductive layer 900 on the side away from the base substrate 100, and the second electrode 600 is composite thin film made of an electrically-conductive silver paste and a highly thermally-conductive material.

In addition, in order to further improve the heat dissipation effect for the top electrode in the light-emitting substrate, in some other embodiments of the present disclosure, as shown in FIG. 8, the light-emitting substrate includes a display region A and a non-display region B surrounding the display region A. The second electrode 600 at least partially covers the non-display region B not covered by the pixel definition layer 700. The light-emitting substrate further includes a second thermally-conductive layer 910 arranged on a side of the base substrate 100 away from the first electrode layer 200. The base substrate 100 is provided in the non-display region B with a thermally-conductive through-hole 920 extending from a side of the base substrate 100 close to the first electrode layer 200 to a side away from the first electrode layer 200, a second thermally-conductive member 930 is arranged in the thermally-conductive through-hole 920, and a part of the second electrode 600 covering the non-display region B is coupled to the second thermally-conductive layer 910 via the second thermally-conductive member 930. The second thermally-conductive member 930 is made of a thermally-conductive metallic material or a thermally-conductive graphene material.

Based on the above, the heat dissipation through-hole is formed in the base substrate 100 outside the display region A, and a heat dissipation path is formed between the second thermally-conductive layer 910 on a back surface of the base substrate 100 (namely, the side away from the first electrode layer 200) and the top electrode via the second thermally-conductive member 930 in the heat dissipation through-hole, so as to dissipate the heat generated by the top electrode to the back surface of the base substrate 100.

The second thermally-conductive member 930 is made of a highly thermally-conductive material such as a metallic material or a graphene-based carbon material. For example, the second thermally-conductive member 930 is made of a material identical to or different from the second electrode 600.

It should be appreciated that, the light-emitting substrate in the embodiments of the present disclosure may be a QLED substrate, i.e., the light-emitting layer 400 includes a quantum-dot light-emitting layer 400. In addition, the light-emitting substrate may also be an OLED substrate, i.e., the light-emitting layer 400 includes an organic light-emitting layer 400.

It should be further appreciated that, the light-emitting substrate further includes a Thin Film Transistor (TFT) array driving layer and an encapsulation layer (not shown). The TFT array driving layer is arranged between the first electrode layer 200 and the base substrate 100 and coupled to the first electrode layer 200.

In addition, the light-emitting substrate in the embodiments of the present disclosure may be a normal light-emitting substrate, that is, the bottom electrode (the first electrode) is an anode and the top electrode (the second electrode) is a cathode. Correspondingly, the light-emitting substrate is a top-emission substrate, the first functional layer 300 includes a hole injection layer and a hole transport layer, and the second functional layer 500 includes an electron injection layer and an electron transport layer. The light-emitting substrate may also be an inverted light-emitting substrate, that is, the bottom electrode (the first electrode) is a cathode and the top electrode (the second electrode) is an anode. Correspondingly, the light-emitting substrate is a bottom-emission substrate, the first functional layer 300 includes an electron injection layer and an electron transport layer, and the second functional layer 500 includes a hole transport layer 510 and a hole injection layer 520. It should be appreciated that, according to the practical needs, the light-emitting substrate may further include any other functional layers, for example, an electron blocking layer, and a hole blocking layer (not shown).

It should be further appreciated that, the light-emitting substrate is arranged on a base substrate, and the base substrate is a transparent substrate with a TFT array driving layer, for example, a substrate made of glass, quartz, or polyethylene terephthalate (PET).

The first electrode is an indium tin oxide (ITO) conductive film or an ITO/Ag/ITO composite transparent conductive film.

When the first functional layer includes the functional layers such as the electron transport layer and the electron injection layer, the first functional layers in different pixels may have a same thickness or different thicknesses according to the practical needs. For example, when the light-emitting substrate includes a red sub-pixel, a green sub-pixel and a blue sub-pixel, the thickness of the first functional layer in the red sub-pixel is 30 nm to 60 nm, e.g., 40 nm to 60 nm, the thickness of the film layer in the green sub-pixel is 30 nm to 60 nm, e.g., 30 nm to 50 nm or 30 nm to 40 nm, and the thickness of the film layer in the blue sub-pixel is 20 nm to 60 nm, or 20 nm to 40 nm. The first functional layer is made of zinc oxide (ZnO) nanoparticles or a sputtered ZnO film, or a ZnO material doped with Ga, Al, Mg, Y, Zr, Li, Cu, Mo, etc.

The light-emitting layer includes a quantum-dot light-emitting layer or an organic light-emitting layer. For example, in a possible embodiment of the present disclosure, when the light-emitting layer includes a quantum-dot light-emitting layer, the red quantum-dot light-emitting layer has a thickness of 20 nm to 30 nm and includes about 2-3f quantum-dot layers. The green quantum-dot light-emitting layer has a thickness of 20 nm to 30 nm and includes about 2-3 quantum-dot layers. The blue quantum-dot light-emitting layer has a thickness of 20 nm to 30 nm and includes about 2-3 quantum-dot layers.

When the second functional layer includes the functional layer such as the hole transport layer, according to the practical needs, the second functional layer in different pixels have a same thickness or different thicknesses, and the thickness of the second functional layer ranges from 5 nm to 10 nm.

The second electrode is a common top electrode and it is a transparent conductive thin film or an opaque conductive thin film.

In the top-emission light-emitting substrate, the top electrode may be a transparent film or a semi-transparent film for a screen or transparent display product with a high resolution (above 120 ppi). The transparent film for the second electrode is made of a conductive oxide such as indium zinc oxide (IZO), and a thickness thereof ranges from 60 nm to 200 nm, e.g., 80 nm to 100 nm, so as to ensure the excellent conductivity. The semi-transparent film is a thin metal film such as an Al film, an Ag film or an Mg:Ag alloy film having a thickness of 10 nm to 20 nm.

In the bottom-emission light-emitting substrate, the top electrode is an opaque film for a display screen with a low resolution, and it is a metal film with a thickness of 80 nm to 150 nm.

The present disclosure further provides in some embodiments a light-emitting device including a plurality of the above-mentioned light-emitting substrates arranged in an array form.

Some description will be given as follows.
(1) The drawings merely relate to structures involved in the embodiments of the present disclosure, and the other structures may refer to those known in the art.
(2) For clarification, in the drawings for describing the embodiments of the present disclosure, a thickness of a layer or region is zoomed out or in, i.e., these drawings are not provided in accordance with an actual scale. It should be appreciated that, in the case that such an element as layer, film, region or substrate is arranged "on" or "under" another element, it may be directly arranged "on" or "under" the other element, or an intermediate element may be arranged therebetween.
(3) In the case of no conflict, the embodiments of the present disclosure and the features therein may be combined to acquire new embodiments.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:
1. A light-emitting substrate, comprising:
a first electrode layer on a base substrate;
a pixel definition layer arranged on a part of the first electrode layer and a part of the base substrate not covered by the first electrode layer, the pixel definition layer comprising at least two pixel definition aperture regions and a non-pixel aperture region other than the pixel definition aperture regions, the non-pixel aperture region being arranged with a groove on a side surface away from the base substrate, and a first thermally-conductive member being arranged in the groove;
a first functional layer, a light-emitting layer and a second functional layer arranged in the pixel definition aperture regions; and
a second electrode covering the second functional layer and the pixel definition layer, the second electrode being coupled to the first thermally-conductive member;

wherein the light-emitting substrate comprises a display region and a non-display region surrounding the display region, and the second electrode at least partially covers the non-display region not covered by the pixel definition layer, wherein the light-emitting substrate further comprises a second thermally-conductive layer arranged on a side of the base substrate away from the first electrode layer, the base substrate is provided in the non-display region with a thermally-conductive through-hole extending from a side of the base substrate close to the first electrode layer to a side away from the first electrode layer, a second thermally-conductive member is arranged in the thermally-conductive through-hole, and a part of the second electrode covering the non-display region is coupled to the second thermally-conductive layer via the second thermally-conductive member.

2. The light-emitting substrate according to claim 1, wherein the first thermally-conductive member is made of a metallic material and/or a graphene-based carbon material.

3. The light-emitting substrate according to claim 1, wherein the first electrode layer comprises a plurality of first electrode patterns arranged in an array form, an orthogonal projection of the groove onto the base substrate is located between orthogonal projections of adjacent first electrode patterns onto the base substrate, a depth of the groove in a direction perpendicular to the base substrate is less than a thickness of the pixel definition layer in the direction perpendicular to the base substrate, and the first thermally-conductive member in the groove is not in contact with the first electrode pattern adjacent to the groove.

4. The light-emitting substrate according to claim 1, wherein the first thermally-conductive member is arranged at a same layer and made of a same material as the second electrode, the second electrode conformally covers the non-pixel aperture region, the second functional layer and the groove, and the first thermally-conductive member is formed by a part of the second electrode conformally covering the groove.

5. The light-emitting substrate according to claim 1, wherein the first thermally-conductive member is arranged at a same layer and made of a same material as the second electrode, the second electrode covers the non-pixel aperture region, the second functional layer and the groove, a side surface of the second electrode away from the base substrate is a planar surface, and a part of the second electrode in the groove is the first thermally-conductive member.

6. The light-emitting substrate according to claim 1, wherein the first thermally-conductive member is arranged at a layer different from the second electrode, the groove is filled up with the first thermally-conductive member, the second electrode covers the non-pixel aperture region, the second functional layer and the first thermally-conductive member, and the first thermally-conductive member is made of a material identical to or different from the second electrode.

7. The light-emitting substrate according to claim 1, wherein the second electrode is covered with a first thermally-conductive layer at a side away from the base substrate, and the first thermally-conductive layer has thermal conductivity greater than the second electrode; and/or the second electrode comprises a composite thin film made of an electrically conductive silver paste and a highly thermally-conductive material having thermal conductivity greater than the electrically conductive silver paste.

8. The light-emitting substrate according to claim 7, wherein the first thermally-conductive layer is made of a graphene-based carbon material, and the composite thin film is made of an electrically conductive silver paste and a graphene-based carbon material.

9. The light-emitting substrate according to claim 1, wherein the second thermally-conductive member is made of a thermally-conductive metallic material and/or a thermally-conductive graphene material.

10. The light-emitting substrate according to claim 1, wherein the light-emitting layer comprises a quantum-dot light-emitting layer.

11. A light-emitting device, comprising the light-emitting substrate according to claim 1.

12. The light-emitting device according to claim 11, wherein the first thermally-conductive member is made of a metallic material and/or a graphene-based carbon material.

* * * * *